United States Patent [19]

Bahng et al.

[11] Patent Number: 5,469,086

[45] Date of Patent: Nov. 21, 1995

[54] FLOATING DETECTION CIRCUIT

[75] Inventors: Sam-yong Bahng; Suk-ki Kim, both of Bucheon, Rep. of Korea

[73] Assignee: Samsung Electronics Co., Ltd., Kyungki-do, Rep. of Korea

[21] Appl. No.: 182,985

[22] Filed: Jan. 19, 1994

[30] Foreign Application Priority Data

Jan. 19, 1993 [KR] Rep. of Korea .......................... 93-590

[51] Int. Cl.[6] .............................. H03K 5/19; H03K 1/04
[52] U.S. Cl. .............................. 327/18; 327/182; 327/299
[58] Field of Search ................................. 327/18, 182, 299

[56] References Cited

U.S. PATENT DOCUMENTS

| | | | |
|---|---|---|---|
| 3,395,291 | 7/1968 | Bogert | 327/299 |
| 4,574,203 | 3/1986 | Baba | 327/299 |
| 4,701,634 | 10/1987 | Schuetz et al. | 327/299 |
| 5,025,172 | 6/1991 | Carroll et al. | 327/299 |

Primary Examiner—Margaret Rose Wambach
Attorney, Agent, or Firm—Sughrue, Mion, Zinn, Macpeak & Seas

[57] ABSTRACT

A floating detection circuit detects the floating state of an input node which can receive an externally applied DC input signal, and includes a pulse generator, a counter and a floating state discriminator. The pulse generator is coupled to the input node and supplies a pulse signal to the input node when the input node is in a floating state. The counter receives the pulse signal and counts the number of pulses included in the pulse signal during predetermined intervals. The floating state discriminator compares the number of pulses with a predetermined reference number, so as to produce a floating detection signal, wherein the floating detection signal indicates whether or not the input node is in a floating state. A semiconductor circuit includes this floating detection circuit and a DC level detector. The floating detection circuit included in the semiconductor circuit detects the input node state during a first period and produces the floating detection signal during a second period. The DC level detector is coupled to the input node and measures the level of the DC signal applied to the input node during the second period when the input node is not in a floating state.

21 Claims, 4 Drawing Sheets

FLOATING DETECTION CIRCUIT

BACKGROUND OF THE INVENTION

1. Field of the Invention

The present invention relates to a semiconductor circuit and; more particularly, to a semiconductor circuit having a floating detection circuit which detects the floating state of an input node to which a DC signal is input.

Korean Patent Application No. 93-590 is incorporated by reference herein for all purposes.

2. Discussion of Related Art

A "floating" state is one where no signal is applied to the input node of a device, e.g., where neither a logic "high" nor logic "low," exists. If no signal is applied to the input node, the level detected at the input node is determined according to the specific environmental condition of the internal circuitry. In other words, while the input node is actually in the floating state, the state of the input node may be determined to be either a logic "high" or a logic "low" depending on the internal circuitry, and as a result, the semiconductor circuit may malfunction so as to cause problems in the entire system, including such a semiconductor circuit. Specifically, for semiconductor circuits having high input impedance typically greater than 10 M$\Omega$, such as in analog-to-digital converters which convert analog input voltages into digital representations of the voltage, significant levels of noise can appear in the output even when the signal applied to the input node contains very low noise levels. Therefore, it is necessary that such a semiconductor circuit should be controlled depending on the state of the input node.

SUMMARY OF THE INVENTION

Accordingly, it is an object of the present invention to provide a floating detection circuit which detects a floating state of an input node to which a DC signal is input.

Another object of the present invention is to provide a semiconductor circuit which can be controlled based on the state of the input node.

These and other objects, features and advantages according to the present invention are provided by a floating detection circuit for detecting the floating state of an input node which can receive an externally applied DC input signal. The floating detection circuit includes:

a pulse generator coupled to the input node, for supplying a pulse signal to the input node;

a counter receiving the pulse signal and counting the number of pulses included in the pulse signal during predetermined intervals; and a comparator for comparing the number of pulses with a predetermined reference number, so as to produce a floating detection signal, wherein the floating detection signal indicates whether or not the input node is in a floating state.

According to one aspect of the present invention, the pulse generator of the floating detecting circuit includes:

a first reference source for serving a first reference potential;

a second reference source for serving a second reference potential different from the first reference potential;

a first switching element coupled to the first reference source, which is periodically turned on;

a first capacitor having one end coupled to the first reference source through said first switching element and the other end coupled to the input node;

a second switching element having one end coupled to the first reference source through said first switching element and the other end coupled to the input node, which is periodically turned on in opposition to the first switching element;

a third switching element coupled to the second reference source, which is periodically turned on in opposition to the first switching element;

a second capacitor having one end coupled to the second reference source through said third switching element and the other end coupled to the input node; and a fourth switching element having one end coupled to the second reference source through said third switching element and the other end coupled to the input node, which is periodically turned on in accordance with the first switching element.

The first and fourth switching elements may be constituted by PMOS transistors, and the second and third switching elements may be constituted by NMOS transistors.

The floating detection circuit may also include a pulse shaping buffer such as a hysteresis inverter coupled between the input node and the counter and a third capacitor coupled between the output of the hysteresis inverter and ground, for removing high-frequency noise components from the input to the counter.

According to another aspect of the present invention, the pulse generator includes:

a first reference source for serving a first reference potential;

a second reference source for serving a second reference potential different from the first reference potential;

a first load element coupled to the first reference source, which serves as a current source;

a fifth switching element coupled between the first load element and the input node, which is periodically turned on;

a second load element coupled to the second reference source, which serves as a current source; and a sixth switching element coupled between the second load element and the input node, which is periodically turned on in opposition to the fifth switching element. The fifth switching element may be constituted by a PMOS transistor, where the sixth switching element may be constituted by an NMOS transistor.

These and other objects, features and advantages according to the present invention are provided by a semiconductor circuit having an input node to which an external DC signal is applied. Advantageously, the circuit includes a floating detector coupled to said input node, for detecting the state of said input node during a first period and producing a floating detection signal indicating whether or not said input node is in a floating state during a second period, and a DC level detector coupled to said input node, for measuring the level of the DC signal applied to said input node during the second period, when the floating detection signal indicates that said input node is not in a floating state.

These and other objects, features and advantages of the invention are disclosed in or apparent from the following description of preferred embodiments.

BRIEF DESCRIPTION OF THE DRAWINGS

The above objects and other advantages of the present invention will become more apparent by describing in detail a preferred embodiment thereof with reference to the attached drawings in which:

FIG. 3A through FIG. 3E illustrate a plurality of waveforms which are useful in explaining the operation of the semiconductor circuit shown in FIG. 1 and FIG. 2, wherein FIG. 3A represents the voltage waveform of the input node, FIG. 3B represents the voltage waveform of the output of hysteresis inverter, FIG. 3C represents the waveform of the reset signal, FIG. 3D represents the waveform of the floating detection signal, and FIG. 3E represents the waveform of the enable signal which is applied to the DC level detector shown in FIG. 1;

DETAILED DESCRIPTION OF THE PREFERRED EMBODIMENTS

Figure 1:
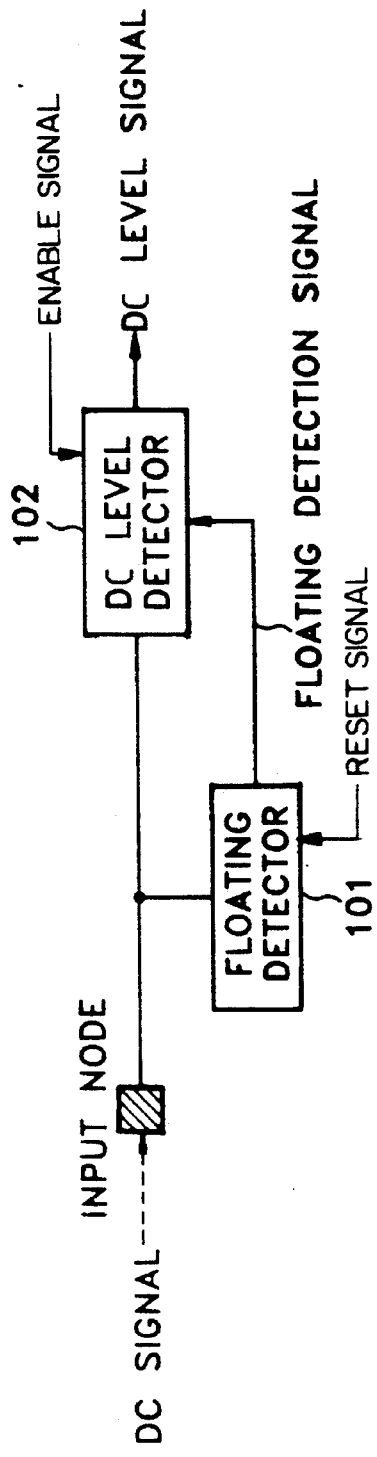
FIG. 1 is a high level block diagram of a semiconductor circuit according to the present invention.

FIG. 1 is a block diagram of a semiconductor circuit according to the present invention. The semiconductor circuit advantageously includes a floating detector 101 and a DC level detector 102.

Referring to FIG. 1, floating detector 101 is preferably coupled to the input node to which a DC signal is input. The input node is also coupled to DC level detector 102. Floating detector 101 detects the state of the input node during a first period and produces a floating detection signal representing whether or not the input node is in a floating state during a second period. Here, the floating detection signal is affected by the state detected during the previous first period. DC level detector 102 measures the level of the DC signal applied to the input node during the second period when the floating detection signal indicates that the input node is not in a floating state. In other words, DC level detector 102 does not measure the level of the input node when the input node is in a floating state.

Figure 2:
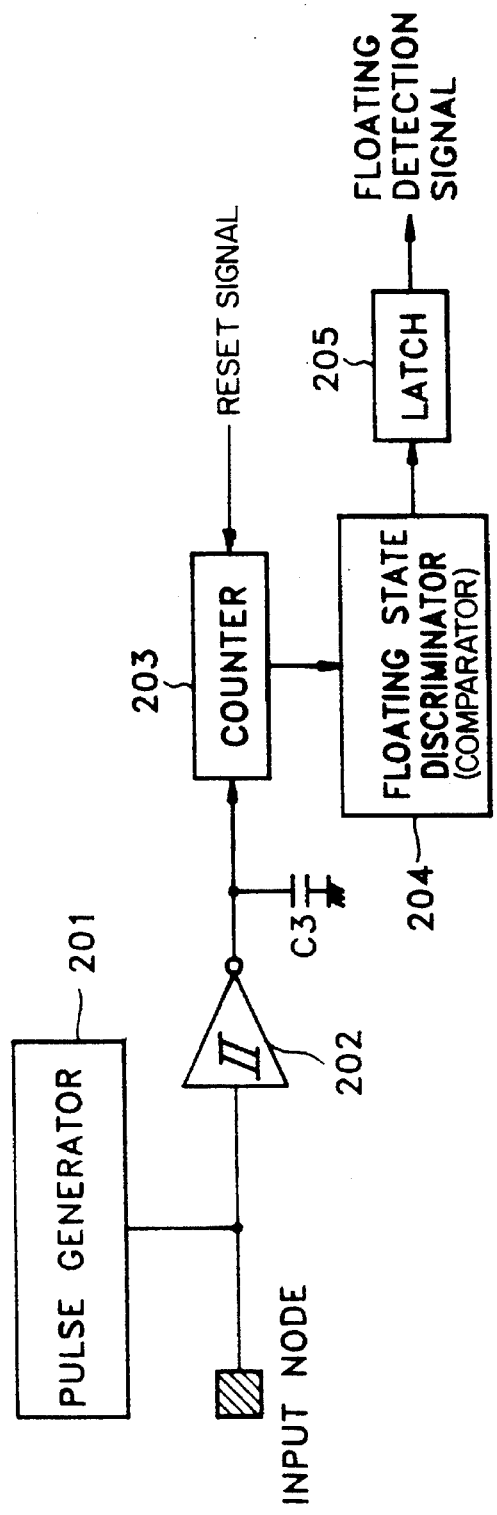
FIG. 2 is a high level block diagram of the floating detector shown in FIG. 1.

FIG. 2 is a block diagram of a floating detector 101 shown in FIG. 1, according to the present invention. The floating detector includes a pulse generator 201, a hysteresis inverter 202, a capacitor C3, a counter 203, a floating state discriminator 204 and a latch 205.

As shown FIG. 2, the pulse generator 201 is coupled to the input node. The input node is also coupled to the input end of hysteresis inverter 202, and capacitor C3 is coupled between the output end of hysteresis inverter 202 and ground. The output end of the hysteresis inverter 202 is also coupled to the input end of counter 203 and the output of counter 203 is applied to floating state discriminator 204. Latch 205 receives the output of floating state discriminator 204.

The pulse generator 201 applies a pulse signal to the input node when the input node is in a floating state, and causes the input node to transfer a DC signal when the input node is not floating. Hysteresis inverter 202 serves as a pulse shaping buffer which pulse-shapes the signal applied at the input node. Specifically, hysteresis inverter 202 performs the pulse-shaping by inverting the input node signal. Capacitor C3 removes high frequency noise from the output signal of hysteresis inverter 202.

Counter 203 receives the pulse-shaped signal and counts the number of pulses included in the pulse-shaped signal during predetermined intervals. Counter 203 is periodically reset by a reset signal before counting the pulses. Floating state discriminator 204 compares the number of pulses with a predetermined reference number, so as to produce a floating detection signal. Here, the floating detection signal indicates whether or not the input node is in a floating state. For example, the floating detection signal is set to a logic "high" when the number of pulses is greater than or equal to the reference number, and is set to a logic "low" when the number of pulses is lower than the reference number.

Latch 205 receives the floating detection signal from counter 203 at a specific point in time. Here, the specific point in time preferably occurs before the enable signal for DC level detector 102 becomes active.

Figure 3A:
Figure 3B:
Figure 3C:
Figure 3D:
Figure 3E:

FIG. 3A through FIG. 3E show waveforms for explaining the operation of the semiconductor circuit shown in FIG. 1 and FIG. 2, wherein FIG. 3A represents the voltage waveform of the input node; FIG. 3B represents the voltage waveform of the output of the hysteresis inverter; FIG. 3C represents the waveform of a reset signal; FIG. 3D represents the waveform of the floating detection signal; and FIG. 3E represents the waveform of the enable signal applied to the DC level detector 102, shown in FIG. 1.

As shown in FIG. 3A and FIG. 3B, the input node signal may be an incomplete pulse signal, and the pulse shaping buffer such as hysteresis inverter 202 changes the incomplete pulse signal into a complete pulse signal. In FIG. 3A and FIG. 3B, the period when the pulses are present corresponds to a first period. It should be noted that the active duration of the enable signal, shown in FIG. 3E, corresponds to a second period.

The reset signal shown in FIG. 3C is applied to counter 203 and corresponds to the initial time of the first period.

The floating detection signal is present only during the second period, as shown in FIG. 3D. Alternatively, the floating detection signal may be present for the entire duration and the state of the floating detection signal transitions at the end of the first period or before the second period.

Figure 4:
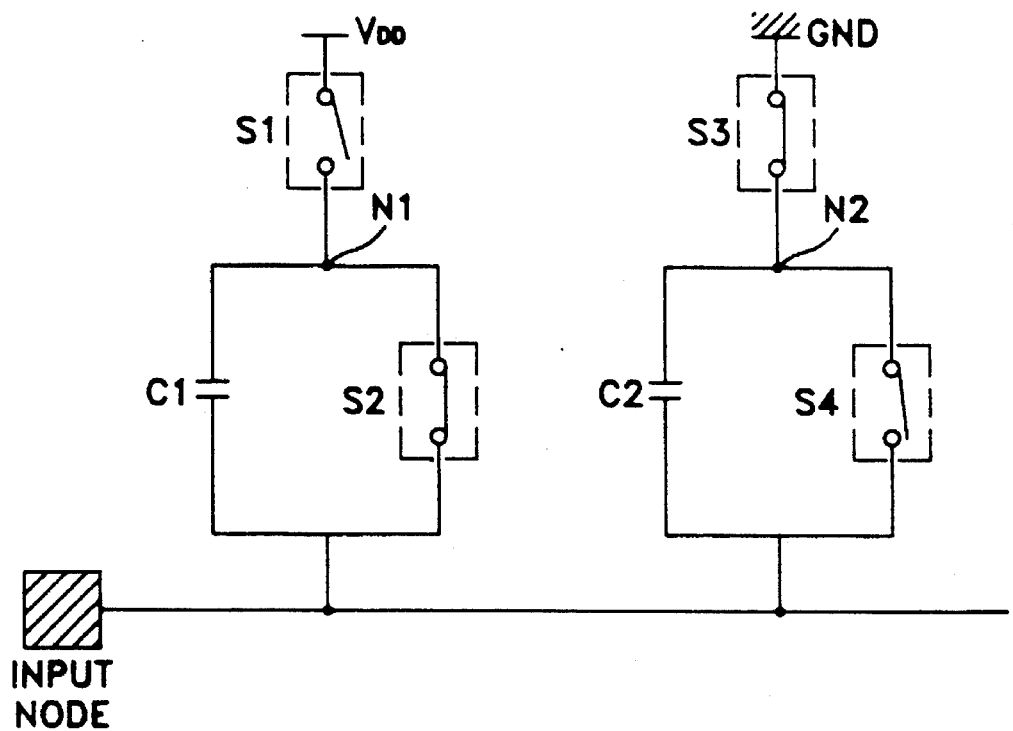
FIG. 4 is a circuit diagram of the pulse generator shown in FIG. 2, according to one embodiment of the present invention.

The pulse generator 201 produces the pulses shown in FIG. 3A. FIG. 4 is a circuit diagram of the pulse generator 201 shown in FIG. 2, according to one embodiment of the present invention. The pulse generator includes four switching elements S1, S2, S3 and S4 and two capacitors C1 and C2.

In FIG. 4, $V_{DD}$ is a first reference source and ground is a second reference source. The first reference source $V_{DD}$ serves as a first reference potential and the second reference source GND serves as a second reference potential which is different from the first reference potential. The pulse generator is used for pulling the input node between the first and second reference potentials during a floating state. One end of switching element S1 is coupled to the first reference source $V_{DD}$, and switching element S2 is coupled between the other end of switching element S1 and the input node. Capacitor C1 is coupled between the other end of switching element S1 and the input node, thus, the capacitor C1 is connected in parallel with switching element S2. Similarly, one end of switching element S3 is coupled to the second reference source, or ground. Switching element S4 is coupled between the other end of switching element S3 and the input node, and capacitor C2 is coupled between the other end of switching element S3 and the input node, thus, the capacitor C2 is connected in parallel with switching element S4.

Switching element S1 is periodically turned on (closed), and switching element S2 is periodically turned on (closed) in opposition to the switching element S1, so that S2 is on when S1 is off, and S2 is off when S1 is on. Switching element S3 is turned on/off (closed/open) in synchronization with switching element S2, while switching element S4 is turned on/off (closed/open) in synchronization with switching element S1.

Therefore, when switching elements S1 and S4 are on and switching elements S2 and S3 are off, the potential of the first reference source $V_{DD}$ is transferred to the node N1 and the node N2 has a potential equal to that of the input node. In the meantime, when switching elements S2 and S3 are on and switching elements S1 and S4 are off, the potential of the second reference source GND is transferred to the node N2 and the node N1 has a potential equal to that of the input node.

First, the case of a floating input node is considered. Switching elements S2 and S4 are alternatively turned on, thereby the connection between the nodes N1 and N2 consists of a series connection through either capacitor C1 or C2, respectively. Node N1 is periodically connected to the first reference potential through switching element S1 and node N2 is periodically connected to the second reference potential. Therefore, when switching element S2 is on, the potential of the input node is equal to that of the node N1, which is the first reference potential, and capacitor C2 is charged in proportion to the difference between the first reference potential and the second reference potential. Meanwhile, when switching element S4 is on, the potential of the input node is equal to that of the N2, which is the second reference potential, and capacitor C1 is charged in proportion to the difference between the first reference potential and the second reference potential. As a result, if the input node is in floating state, a pulse signal appears on the input node, whose levels correspond to the first reference potential and the second reference potential, respectively.

Next, we will consider the case in which an input DC signal is applied to the input node. When switching elements S1 and S4 are on, capacitor C1 is charged in proportion to the difference between the DC level of the input node and the first reference potential, and the node N2 has a potential equal to the DC level of the input node. Meanwhile, if switching elements S2 and S3 are on, the potential of the node N1 becomes equal to the DC level of the input node due to the discharging of capacitor C1 through switching element S2. Also, the node N2 has a potential equal to the second reference potential, with capacitor C2 being charged in proportion to the difference between the DC level of the input node and the second reference potential. Then, when switching elements S1 and S4 again turn on, the potential of the node N2 becomes equal to the DC level of the input node by discharging capacitor C2 through switching element S4, and the potential of node N1 becomes equal to the first reference potential. Here, capacitor C1 is charged in proportion to the difference between the first reference potential and the DC level of the input node. As a result, even if one of switching elements S2 and S4 turns on, neither the first reference potential nor the second reference potential is transferred to the input node, thus the input node retains the constant DC level applied thereto.

Figure 5:
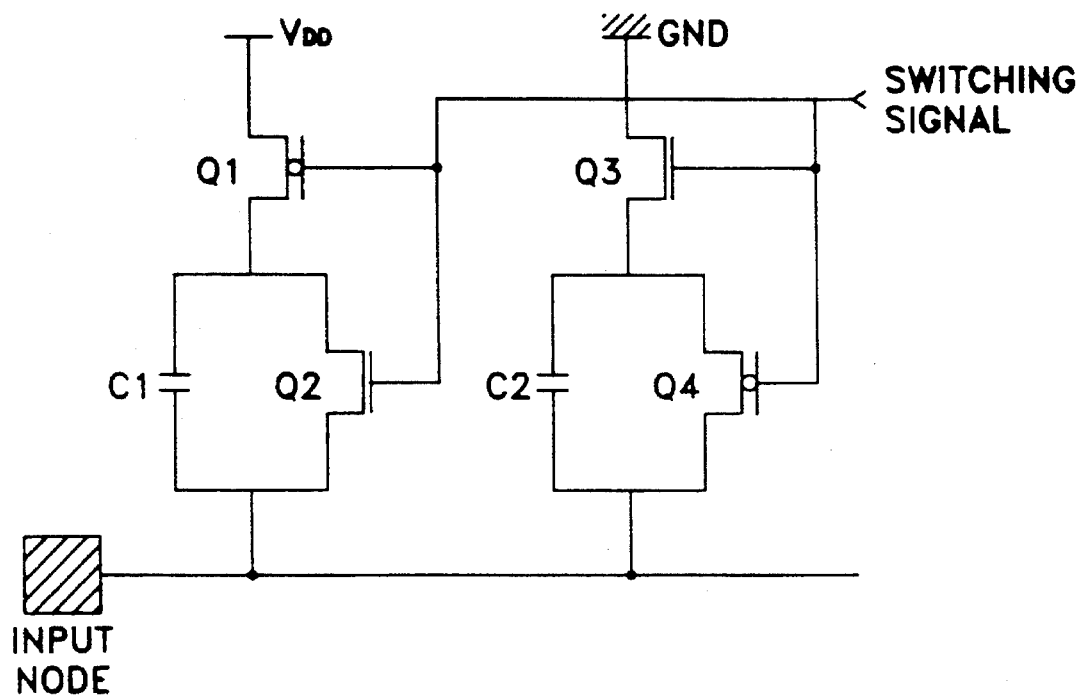
FIG. 5 is a detailed circuit diagram of the pulse generator which corresponds to that shown in FIG. 4.

FIG. 5 is a detailed circuit diagram of the pulse generator which corresponds to that shown in FIG. 4.

Figure 6:
FIG. 6 is a waveform of a switching signal.

Referring to FIG. 5, switching element S1 and S4 are constituted by PMOS transistors Q1 and Q4, respectively. Here, switching elements S2 and S3 are constituted by NMOS transistors Q2 and Q3. A switching signal, shown in FIG. 6, is applied to the gates of the PMOS and NMOS transistors.

Figure 7:
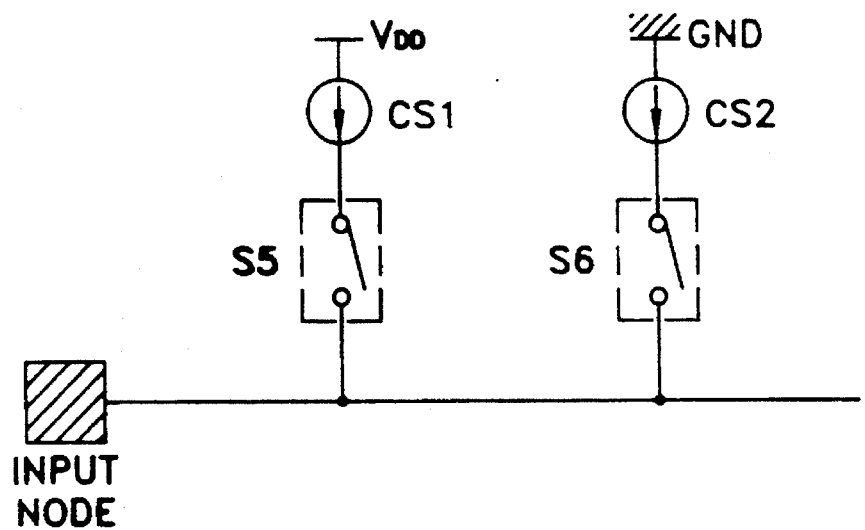
FIG. 7 is a circuit diagram of the pulse generator shown in FIG. 2, according to another embodiment of the present invention.

FIG. 7 is a circuit diagram of the pulse generator shown in FIG. 2, according to another embodiment of the present invention. The pulse generator includes current sources CS1 and CS2 and switching elements S5 and S6.

Referring to FIG. 7, current source CS1 is coupled to the first reference source $V_{DD}$ and current source CS2 is coupled to the second reference source GND. Current sources CS1 and CS2 also serve as load elements. Switching elements S5 and S6 are alternatively turned on. Therefore, for the case in which the input node is floating, when switching element S5 turns on, the first reference potential is transferred to the input node. Here, if switching element S6 turns on, the input node has the potential equal to the second reference potential. That is, the input node is presented with a pulse signal whose level changes between the first reference potential and the second reference potential.

Meanwhile, when the input node is applied with a DC signal, the potential difference between the first reference potential and the DC level is distributed through current source CS1 and the potential difference between the second reference potential and the DC level is distributed through current source CS2. Therefore, the input node retains the constant DC level applied thereto.

Figure 8:
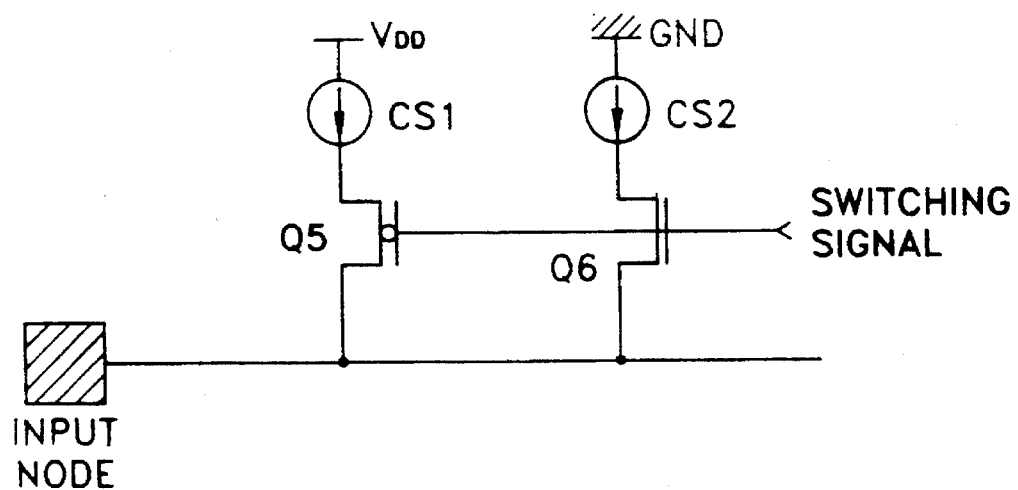
FIG. 8 is a detailed circuit diagram of the pulse generator, which corresponds to that shown in FIG. 7.

FIG. 8 is a detailed circuit diagram of the pulse generator, which corresponds to that shown in FIG. 7.

In FIG. 8, switching element S5 is constituted by PMOS transistor Q5 and switching element S6 is constituted by NMOS transistor Q6. In addition, the switching signal shown in FIG. 6 is applied to the gates of the PMOS and NMOS transistors.

As described above, the floating detection circuit of the present invention produces a floating detection signal which denotes whether or not the input node is in a floating state. Also, semiconductor circuits of the present invention include this floating detection circuit and a DC level detector 102, so as to prevent the incorrect operation of the DC level detector 102 when the input node is floating. In addition, when the floating detection signal, shown in FIG. 3D, produced from the floating detection circuit is active, if necessary, power consumption can be reduced by cutting off a power source.

Other modifications and variations to the invention will be apparent to those skilled in the art from the foregoing disclosure and teachings. Thus, while only certain embodiments of the invention have been specifically described herein, it will be apparent that numerous modifications may be made thereto without departing from the spirit and scope of the invention. In particular, circuitry other than that disclosed can be used for shifting the input node potential between the reference potential sources, and other embodiments may suggest themselves to others skilled in the art, and are within the scope of the invention.

What is claimed:

1. A floating detection circuit for detecting the floating state of an input node which can receive an externally applied DC signal, comprising:

a pulse generator coupled to said input node, for supplying a pulse signal to the input node;

a counter for receiving said pulse signal and counting the number of pulses included in the pulse signal during predetermined intervals; and a comparator for comparing the number of pulses with a predetermined reference number, so as to produce a floating detection signal, wherein said floating detection signal indicates whether or not the input node is in a floating state.

2. A floating detecting circuit according to claim 1, wherein said pulse generator comprises:

a first reference source for serving a first reference potential;

a second reference source for serving a second reference potential which is different from said first reference potential;

a first switching element coupled to said first reference source, which is periodically turned on;

a first capacitor having one end coupled to said first reference source through said first switching element and the other end coupled to said input node;

a second switching element having one end coupled to said first reference source through said first switching element and the other end coupled to said input node, which is periodically turned on in opposition to said first switching element;

a third switching element coupled to said second reference source, which is periodically turned on in opposition to said first switching element;

a second capacitor having one end coupled to said second reference source through said third switching element and the other end coupled to said input node; and a fourth switching element having one end coupled to said second reference source through said third switching element and the other end coupled to said input node, which is periodically turned on in accordance with said first switching element.

3. A floating detection circuit according to claim 2, wherein said first and fourth switching elements are constituted by PMOS transistors, and said second and third switching elements are constituted by NMOS transistors.

4. A floating detection circuit according to claim 1, further comprising a pulse shaping buffer coupled between the input node and said counter.

5. A floating detection circuit according to claim 4, further comprising a third capacitor coupled between the output of said pulse shaping buffer and ground, for removing high-frequency noise components from the input to the counter.

6. A floating detection circuit according to claim 4, wherein said pulse shaping buffer is a hysteresis inverter.

7. A floating detection circuit according to claim 6, further comprising a third capacitor coupled between the output of said hysteresis inverter and ground, for removing high-frequency noise components from the input to the counter.

8. A floating detection circuit according to claim 1, wherein said pulse generator comprises:

a first reference source for serving as a first reference potential;

a second reference source for serving as a second reference potential which is different from said first reference potential;

a first load element coupled to said first reference source, which serves as a current source;

a fifth switching element coupled between said first load element and said input node, which is periodically turned on;

a second load element coupled to said second reference source, which serves as a current source; and a sixth switching element coupled between said second load element and said input node, which is periodically turned on in opposition to said fifth switching element.

9. A floating detecting circuit according to claim 8, wherein said fifth switching element is constituted by a PMOS transistor and said sixth switching element is constituted by an NMOS transistor.

10. A semiconductor circuit having an input node to which an external DC signal is applied, comprising:

a floating detector coupled to said input node, for detecting the state of said input node during a first period and producing a floating detection signal indicating whether or not said input node is in a floating state during a second period; and a DC level detector coupled to said input node, for measuring the level of the DC signal applied to said input node during the second period, when the floating detection signal indicates that said input node is not in a floating state.

11. A semiconductor circuit according to claim 10, wherein said floating detector comprises:

pulse generator coupled to the input node, for providing a pulse signal to said input node;

a counter for receiving said pulse signal and counting the number of pulses included in the pulse signal during predetermined intervals; and a comparator for comparing the number of pulses with a predetermined reference number, so as to produce a floating detection signal, wherein the floating detection signal indicates whether or not the input node is in a floating state.

12. A semiconductor circuit according to claim 11, wherein said pulse generator comprises:

a first reference source for serving as a first reference potential;

a second reference source for serving as a second reference potential which is different from said first reference potential;

a first switching element coupled to said first reference source, which is periodically turned on;

a first capacitor having one end coupled to said first reference source through said first switching element and the other end coupled to said input node;

a second switching element having one end coupled to said first reference source through said first switching element and the other end coupled to said input node, which is periodically turned on in opposition to said first switching element;

a third switching element coupled to said second reference source, which is periodically turned on in opposition to said first switching element;

a second capacitor having one end coupled to said second reference source through said third switching element and the other end coupled to said input node; and a fourth switching element having one end coupled to said second reference source through said third switching element and the other end coupled to said input node, which is periodically turned on in accordance with said first switching element.

13. A semiconductor circuit according to claim 12, wherein said first and fourth switching elements are constituted by PMOS transistors, and said second and third switching elements are constituted by NMOS transistors.

14. A semiconductor circuit according to claim 11, wherein said floating detector further comprises a pulse shaping buffer coupled between the input node and said counter.

15. A floating detection circuit according to claim 14, further comprising a third capacitor coupled between the output of said pulse shaping buffer and ground, for removing high-frequency noise components from the input to the counter.

16. A semiconductor circuit according to claim 14, wherein said pulse shaping buffer is a hysteresis inverter.

17. A semiconductor circuit according to claim 16, wherein said floating detector further comprises a third capacitor coupled between the output of said hysteresis inverter and ground, for removing high-frequency noise components emitted from said hysteresis inventer.

18. A semiconductor circuit according to claim 11, wherein said pulse generator comprises:
   a first reference source for serving as a first reference potential;
   a second reference source for serving as a second reference potential which is different from said first reference potential;
   a first load element coupled to said first reference source, which serves as a current source;
   a fifth switching element coupled between said first load element and said input node, which is periodically turned on;
   a second load element coupled to said second reference source, which serves as a current source; and
   a sixth switching element coupled between said second load element and said input node, which is periodically turned on in opposition to said fifth switching element.

19. A semiconductor circuit according to claim 18, wherein said fifth switching element is constituted by a PMOS transistor and said sixth switching element is constituted by an NMOS transistor.

20. A semiconductor circuit having an input node receiving an external DC signal and a DC level detector coupled to said input node for measuring the level of the DC signal in response to a control signal indicating that said input node is not in a floating state, said circuit comprising a floating detector operatively coupled in parallel between said input node and said level detector for detecting the state of said input node, said floating detector characterized in that periodic oscillations between a first potential and a second potential is indicative of a floating state whereas a fixed potential is indicative of an operational state, wherein said control signal is only generated during said operational state.

21. A method for detecting a floating state of an input node which can receive an externally applied DC signal, comprising the steps of:
   supplying a pulse signal to the input node;
   counting the number of pulses included in the pulse signal during predetermined intervals;
   comparing the number of pulses with a predetermined reference number; and
   generating a floating detection signal, so as to permit indication of whether or not the input node is in a floating state.

\* \* \* \* \*